United States Patent
Chu et al.

(10) Patent No.: US 10,372,176 B2
(45) Date of Patent: Aug. 6, 2019

(54) INFORMATION HANDLING SYSTEM WITH A COMMON AIR DUCT FOR MULTIPLE AIR FLOW GUIDING CONFIGURATIONS

(71) Applicant: DELL PRODUCTS, LP, Round Rock, TX (US)

(72) Inventors: Yi-Pai Chu, Taoyuan (TW); Tim Chang, Taipei (TW); Shih-Huai Cho, New Taipei (TW)

(73) Assignee: Dell Products, LP, Round Rock, TX (US)

( * ) Notice: Subject to any disclaimer, the term of this patent is extended or adjusted under 35 U.S.C. 154(b) by 24 days.

(21) Appl. No.: 15/861,264

(22) Filed: Jan. 3, 2018

(65) Prior Publication Data

US 2019/0204883 A1    Jul. 4, 2019

(51) Int. Cl.
 *G06F 1/20* (2006.01)
 *H05K 7/20* (2006.01)

(52) U.S. Cl.
 CPC ............ *G06F 1/20* (2013.01); *H05K 7/20145* (2013.01); *H05K 7/20727* (2013.01)

(58) Field of Classification Search
 CPC ................. H05K 7/20145; H05K 7/20727
 See application file for complete search history.

(56) References Cited

U.S. PATENT DOCUMENTS

| 6,288,898 | B1 | 9/2001 | Johnson et al. | |
|---|---|---|---|---|
| 7,835,149 | B2 * | 11/2010 | Li | G06F 1/20 361/679.49 |
| 8,243,437 | B2 * | 8/2012 | Chou | G06F 1/185 361/679.31 |
| 8,305,752 | B2 * | 11/2012 | Ke | G06F 1/20 165/80.2 |
| 8,411,437 | B2 * | 4/2013 | Shu | H01L 23/467 361/695 |
| 8,605,427 | B2 * | 12/2013 | Chen | H01L 23/467 165/80.3 |
| 2005/0195568 | A1 * | 9/2005 | Shyr | G06F 1/20 361/695 |
| 2011/0171899 | A1 * | 7/2011 | Ye | G06F 1/20 454/284 |
| 2012/0008276 | A1 * | 1/2012 | Cheng | G06F 1/20 361/679.48 |
| 2012/0145363 | A1 * | 6/2012 | Peng | H01L 23/427 165/121 |
| 2014/0182814 | A1 * | 7/2014 | Lin | H05K 7/20145 165/80.2 |
| 2015/0177750 | A1 | 6/2015 | Bailey et al. | |

FOREIGN PATENT DOCUMENTS

DE    102011015547 B3 *  6/2012  .............. G06F 1/20

* cited by examiner

*Primary Examiner* — Robert J Hoffberg
(74) *Attorney, Agent, or Firm* — Larson Newman, LLP

(57) ABSTRACT

An information handling system includes a tray having a central processing unit. A main air duct component mounts on the tray over the central processing unit. The main air duct component includes a first portion having a first side vent region and a second side vent region. The main air duct component receives first and second side covers to cover the first and second side vent regions in response to the main air duct component being in a first configuration. The main air duct component receives a partition within the first portion to direct air flow out of the first and second side vent regions in response to the main air duct component being in a second configuration.

19 Claims, 4 Drawing Sheets

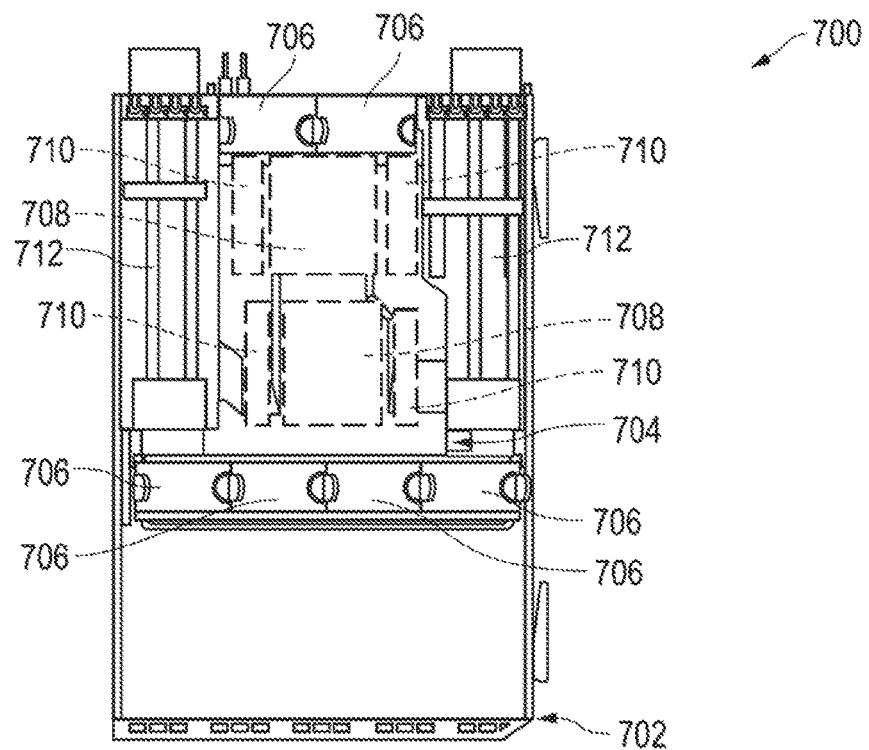
FIG. 7
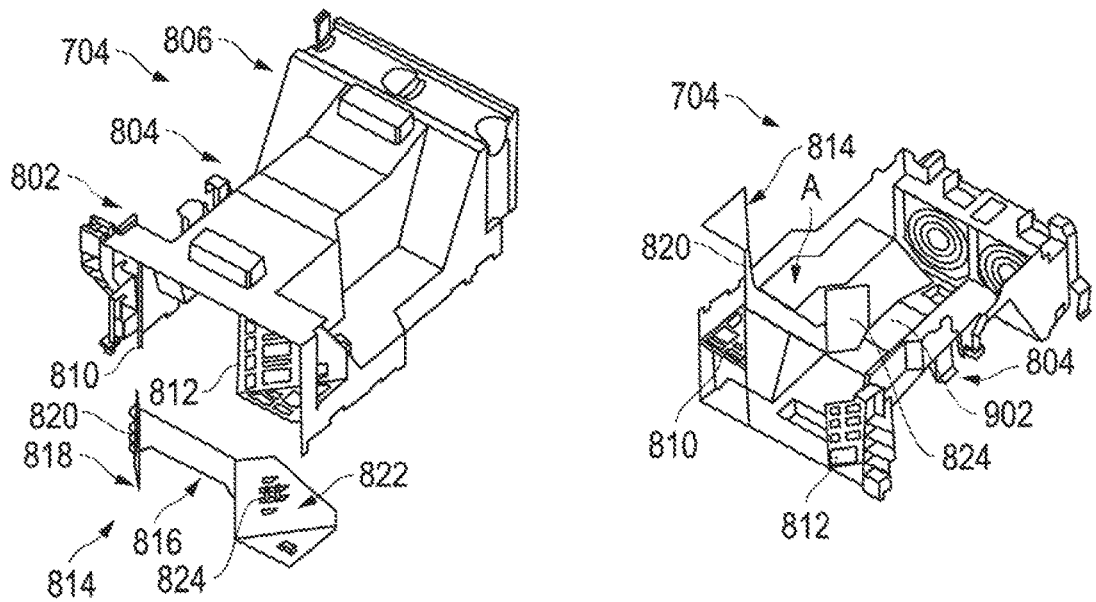
FIG. 8
FIG. 9

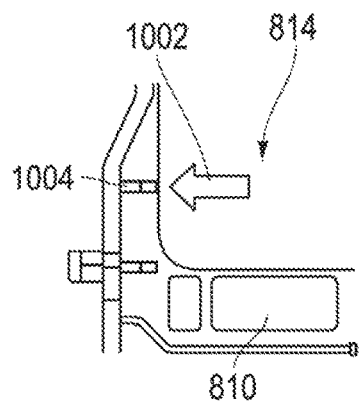
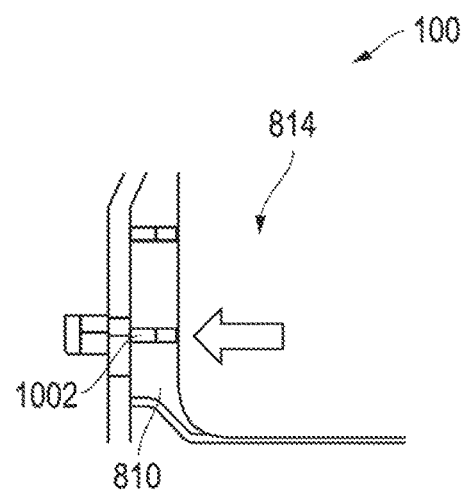
FIG. 10          FIG. 11
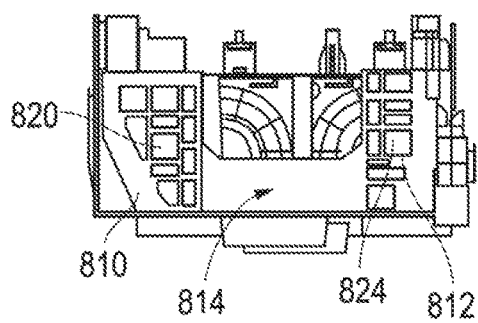
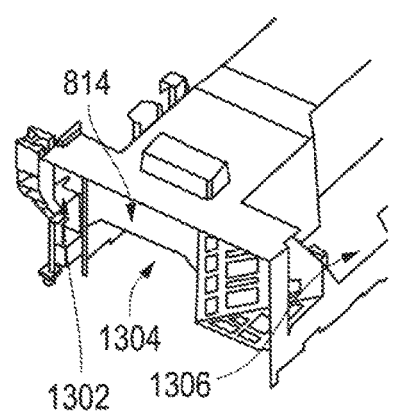
FIG. 12          FIG. 13

A COMMON AIR DUCT FOR MULTIPLE AIR
INFORMATION HANDLING SYSTEM WITH A COMMON AIR DUCT FOR MULTIPLE AIR FLOW GUIDING CONFIGURATIONS

FIELD OF THE DISCLOSURE

The present disclosure generally relates to information handling systems, and more particularly relates to an information handling system with a common air duct for multiple air flow guiding configurations.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a tray and a main air duct component. The main air duct component may mount on the tray over a central processing unit. The main air duct component may receive first and second side covers to cover first and second side vent regions in response to the main air duct component being in a first configuration. The main air duct component may receive a partition within the first portion to direct air flow out of the first and second side vent regions in response to the main air duct component being in a second configuration.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 7 is another diagram of the portion of the information handling system according to at least one embodiment of the disclosure; and FIGS. 8-13 are different perspective views of the main air duct having a partition to direct air flow according to at least one embodiment of the disclosure.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
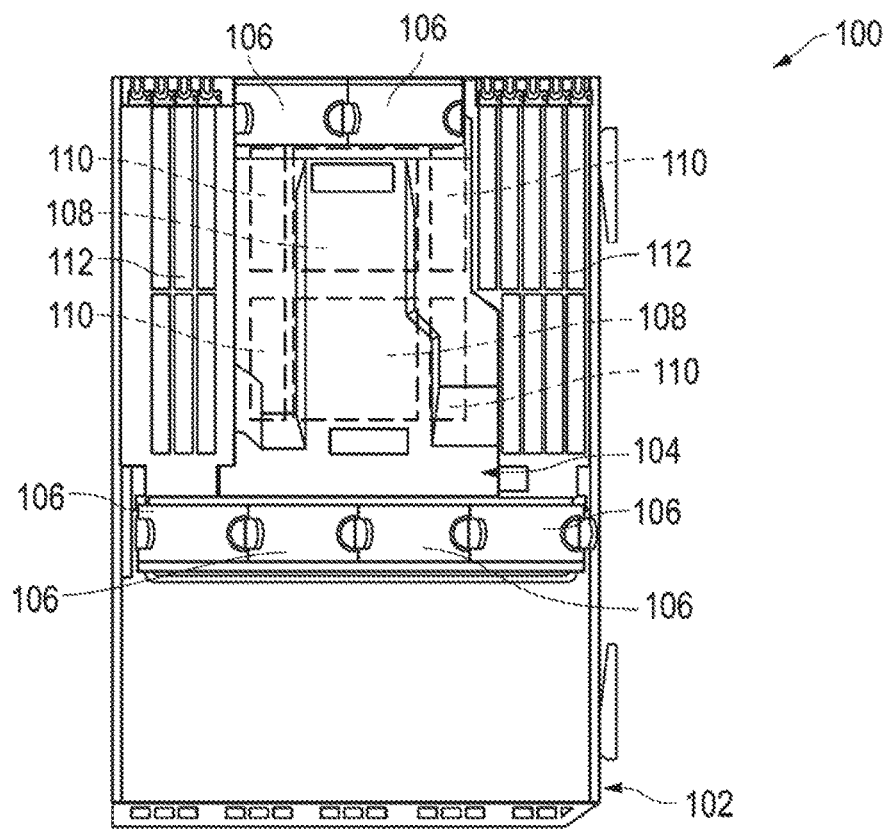
FIG. 1 is a diagram of a portion of an information handling system according to at least one embodiment of the disclosure.

FIG. 1 shows a portion of an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

In the illustrated embodiment of FIG. 1, the information handling system 100 includes tray 102, a main air duct component 104, multiple cooling fans 106, central processing units (CPUs) 108, dual in-line memory modules (DIMMs) 110, and peripheral component interconnect express (PCIe) slots 112. In this configuration of the information handling system 100, the CPUs 108 and the DIMMs 110 can be located on the tray 102 in such a position as to be covered by the main air duct component 104 while the main air duct component 104 is mounted on the tray 102. The PCIe slots 112 can be located in between a first side of the tray 102 and the CPUs 108 and the DIMMs 110, and in between a second side of the tray 102 and the CPUs 108 and the DIMMs 110.

In an embodiment, the cooling fans 106 can be divided into two groups: the cooling fans mounted on the tray 102; and the cooling fans mounted to the main air duct component 104. In an embodiment, a first portion of the cooling fans 106 can be mounted across the tray from a first side of the tray to a second side of the tray. The first portion of cooling fans 106 can create an air flow from a first end of the tray 102 to a second end of the tray 102 by pulling air from the first end and pushing the air toward the second end. The second portion of the cooling fans 106 can increase an amount of air flow through the main air duct component 104 by pulling air from some of the fans in the first portion of fans through an air channel of the main air duct component 104.

In an embodiment, the main air duct component 104 can be utilized in one of two different configurations based on the configuration of the information handling system 100. For example, when the information handling system 100 is configured as shown in FIG. 1, the main air duct component 104 can be placed in a first configuration by connecting first and second side covers 210 and 220, as shown in FIG. 2, to the main air duct component 104.

Figure 2:
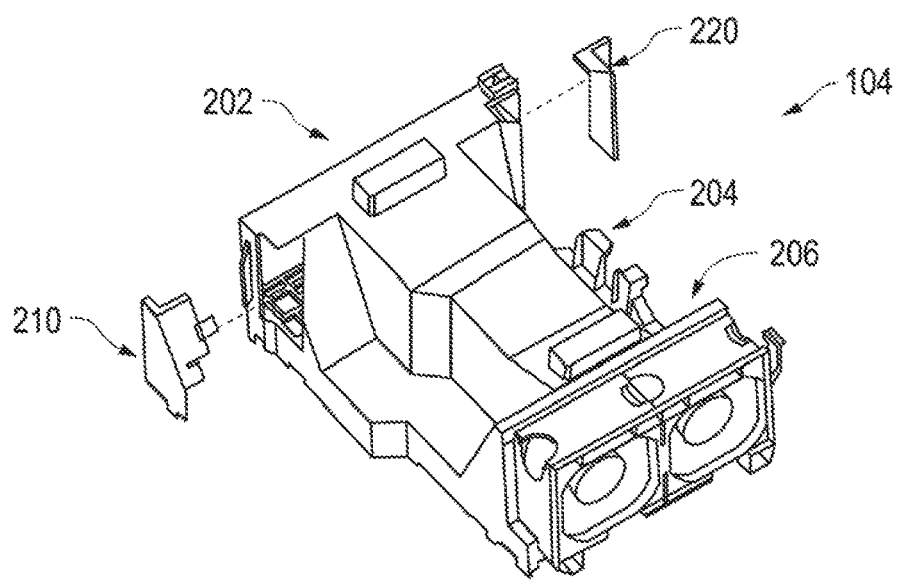
FIG. 2 is a perspective view of a main air duct of the information handling system according to at least one embodiment of the disclosure.

FIG. 2 shows the main air duct component 104 according to at least one embodiment of the disclosure. In this configuration, the main air duct component 104 includes first, second, and third portions 202, 204, and 206. The first portion 202 can be located on a first end of the main air duct component 104. The second portion 204 can be connected to the first portion 202, and can include a main air channel to direct air flow over the CPUs 108 and the DIMMs 110 on the tray 102. The third portion 206 can be connected to the second portion 204 at a second end of the main air duct component 104 that is opposite the first end.

The first portion 202 can include a large opening at the first end of the main air duct component to receive air from the first portion of cooling fans 106 mounted on the tray 102 as shown in FIG. 1. The first portion 202 can also include first and second side vent regions that are located at opposite sides of the first portion. In an embodiment, the first and second side vent regions may allow air from the first portion of cooling fans 106 to leave the main air duct component 104 to create an air flow over the PCIe slots 112. However, the CPUs 108 and DIMMs 110 may generate substantially more heat than the components in the PCIe slots 112. In this situation, the first and second side covers 210 and 220 can be connected to the first portion 202, as will be described in greater detail with respect to FIGS. 3-6 below. The first side cover 210 can close the first side vent region to prevent air flow out of the main air duct component 104 on the first side of the first portion 202. Similarly, the second side cover 220 can close the second side vent region to prevent air flow out of the main air duct component 104 on the second side of the first portion 202.

Figure 3:
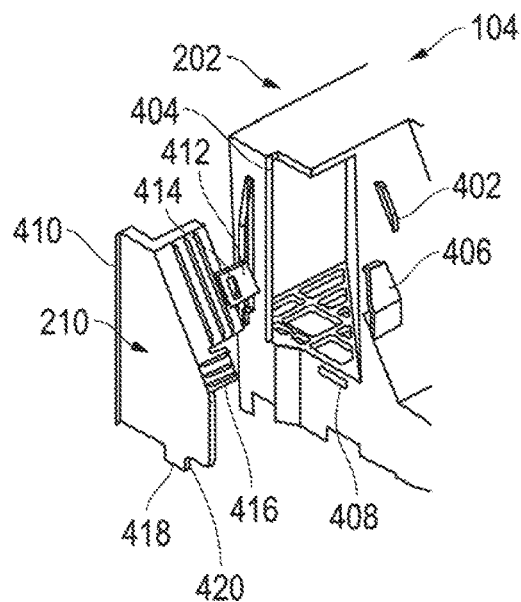
FIGS. 3 and 4 are perspective views of the main air duct having a first side cover according to at least one embodiment of the present disclosure.
Figure 4:
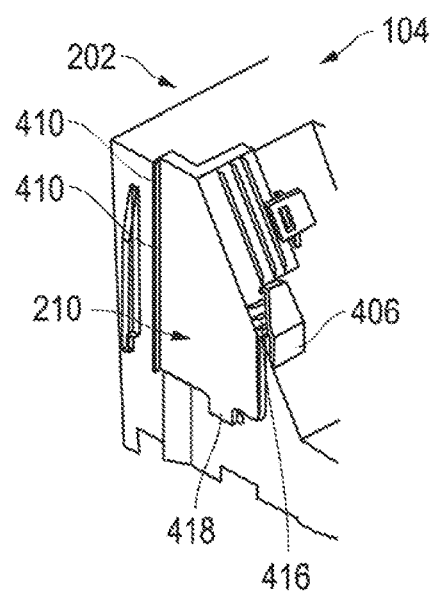

FIGS. 3 and 4 show a first side perspective view of a portion of the main air duct 102 having the first side cover 210 according to at least one embodiment of the present disclosure. The first portion 202 includes a latch 402, a catch 404, a pocket 406, and a slot 408. The first side cover 210 includes a lip 410, a tab 412 with a hook 414, a tab 416, and a tab 418 with a hook 420. In an embodiment, the connection of the first side cover 210 with the first portion 202 of the main air duct component 104 can be tool-less, such that an individual can connect the first side cover 210 with the first portion 202 with only his or her hands.

In an embodiment, the latch 402 and the pocket 404 can be located on a back surface of the first portion 202, the catch 404 can be located on the first side of the main air duct component 104 and in front of the first side vent region, and the slot 408 can be located on the first side of the main air duct component 104 and below the first side vent region. In an embodiment, the lip 410 can be located at a front edge of the first side cover 210, the tab 412 can extend from the first side cover 210 and can include the hook 414, the tab 416 can also extend from the first side cover 210 in the same direction as the tab 412, the tab 418 can extend downward from the first side cover 210 in a direction that is perpendicular to the tabs 412 and 416, and the hook 420 can extend from the tab 418 in the same direction as the tabs 412 and 416.

As the first side cover 210 is placed in physical contact with the first portion 202 of the main air duct component 104, the tab 412 can be inserted within an opening between the latch 402 and the back surface of the first portion 202. At substantially the same point in the connection between the first side cover 210 and the first portion 202, the tab 416 can be inserted within the pocket 406. Also at this point, the hook 420 of the tab 418 can be slightly inserted within the slot 408. As the first side cover 210 is pushed closer the first edge of the first portion 202, the tab 412 can continue to slide within latch 402, the tab 416 can continue to slide within pocket 406, and the hook 420 can continue to slide within the slot 408. When the first side cover 210 is in a latched position with respect to the first portion 202, the hook 414 can slide under the latch 402 and snap fit with the latch 402 to provide a first locking mechanism for the first side cover 210, as shown in FIG. 4. Similarly, the hook 420 can slide through the slot 408 and snap fit with the slot 408 to provide a second locking mechanism for the first side cover 210, as shown in FIG. 4. Additionally, the lip 210 can slide past the catch 404 and snap fit between the catch 404 and an edge of the first portion 202 to provide a third locking mechanism for the first side cover 210, as shown in FIG. 4.

In an embodiment, the first side cover 210 can be removed from the first portion 202 by a force being applied on the tab 412 to release the hook 414 from the latch 402, by another force being applied on the hook 420 to release the hook 420 from the slot 408, and by a force being applied on the catch 404 to release the lip 410. In response to the hooks 414 and 420 and the lip 410 being released from their respective locations, the first side cover 210 can be removed from the first portion 202 such that the first side vent region is available to enable air flow out of the main air duct component 104.

Figure 5:
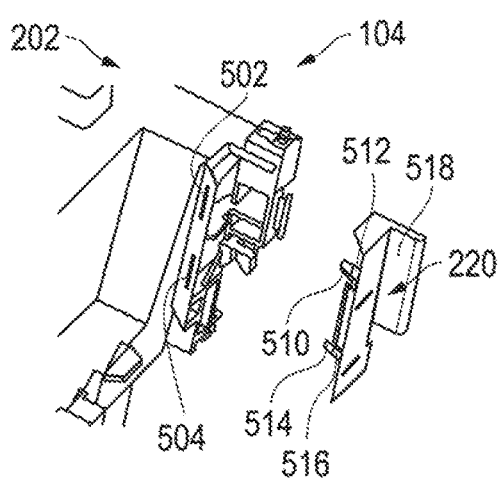
FIGS. 5 and 6 are perspective views of the main air duct having a second side cover according to at least one embodiment of the present disclosure.
Figure 6:
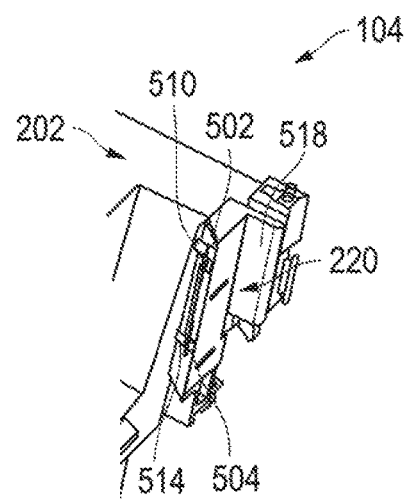

FIGS. 5 and 6 show a second side perspective view of the main air duct 102 having the second side cover 220 according to at least one embodiment of the present disclosure. The second side of the first portion 202 includes latches 502 and 504. The second side cover 220 includes a tab 510 with a hook 512, a tab 514 with a hook 516, and a cover 518. In an embodiment, the connection of the second side cover 220 with the first portion 202 of the main air duct component 104 can be tool-less, such that an individual can connect the second side cover 220 with the first portion 202 with only his or her hands.

In an embodiment, the latches 502 and 504 can be located on a back surface of the first portion 202. In an embodiment, the tab 510 can extend from the second side cover 220 and can include the hook 512, the tab 514 includes the hook 516 and can also extend from the second side cover 220 in the same direction as the tab 510.

As the second side cover 220 is placed in physical contact with the first portion 202 of the main air duct component 104, the tab 510 can be inserted within an opening between the latch 502 and the back surface of the first portion 202. At substantially the same point in the connection between the second side cover 220 and the first portion 202, the tab 514 can be inserted within an opening between the latch 504 and the back surface of the first portion 202. As the second side cover 220 is pushed closer the second edge of the first portion 202, the tab 510 can continue to slide within latch 502, and the tab 514 can continue to slide within latch 504. When the second side cover 220 is in a latched position with respect to the first portion 202, the hook 512 can slide under the latch 502 and snap fit with the latch 502 to provide a first locking mechanism for the second side cover 220, as shown in FIG. 6. Similarly, the hook 516 can slide under the latch 504 and snap fit with the latch 504 to provide a second locking mechanism for the second side cover 220, as shown in FIG. 6. Additionally, the cover 518 can be placed in physical contact with the first portion 202, as shown in FIG. 6.

While the first and second side covers 210 and 220 are securely connected to the first portion 202, the air flow directed by the main air duct component 104 can provide a first amount of air flow through the second portion 204 and over the CPUs 108 and the DIMMs 110, and the remaining cooling fans of the first portion of cooling fans 106 that are not in physical contact with the main air duct component 104 can direct an second amount of air flow over the PCIe slots 112. In an embodiment, the first amount of air flow can be about 66% of the total air flow produced by the first portion of cooling fans 106, and the second amount of air flow can be about 34% of the total air flow. One of ordinary skill in the art will recognize that other divisions of the total air flow between the CPUs 108 and DIMMs 110 and the PCIe slots 112, while the main air duct component 104 is in a first configuration, can be made without varying from the scope of this disclosure.

In an embodiment, the second side cover 220 can be removed from the first portion 202 by a force being applied on the tab 510 to release the hook 512 from the latch 502, and by another force being applied on the tab 514 to release the hook 516 from the latch 504. In response to the hooks 512 and 516 being released from their respective locations, the second side cover 220 can be removed from the first portion 202 such that the first side vent region is available to enable air flow out of the main air duct component 104.

FIG. 7 shows a portion of an information handling system 700. In the illustrated embodiment of FIG. 7, the information handling system 700 includes tray 702, a main air duct component 704, multiple cooling fans 706, CPUs 708, DIMMs 710, and graphic processing units (GPUs) 712. In this configuration of the information handling system 700, the CPUs 708 and the DIMMs 710 can be located on the tray 702 in such a position as to be covered by the main air duct component 704 while the main air duct component 704 is mounted on the tray 702. The GPUs 712 can be located in between a first side of the tray 702 and the CPUs 708 and the DIMMs 710, and in between a second side of the tray 702 and the CPUs 708 and the DIMMs 710.

In an embodiment, the cooling fans 706 can be divided into two groups in a similar fashion and can operate as described above with respect to the cooling fans 106 in FIG. 1. In an embodiment, the main air duct component 704 can be utilized in one of two different configurations based on the configuration of the information handling system 700. For example, when the information handling system 700 is configured as shown in FIG. 7, the main air duct component 704 can be placed in a second configuration by connecting a partition component 814, as shown in FIG. 8, to the main air duct component 704.

FIGS. 8 and 9 show the main air duct component 704 according to at least one embodiment of the disclosure. In this configuration, the main air duct component 704 includes first, second, and third portions 802, 804, and 806, which can be connect together as described with respect to portions 202, 204, and 206 in FIG. 2 above. The second portion 804 includes a main air channel 902 as shown in FIG. 9.

The first portion 802 can include a large opening at the first end of the main air duct component to receive air from the first portion of cooling fans 706 mounted on the tray 702 as shown in FIG. 7. The first portion 802 can also include first and second side vent regions that are located at opposite sides of the first portion. In an embodiment, the first and second side vent regions may allow air from the first portion of cooling fans 706 to leave the main air duct component 704 to create an air flow over GPUs 712. The first portion 702 also includes a grate 810 adjacent to the first side vent region, and a grate 812 adjacent to the second side vent region. The partition component 814 includes a main section 816, a first side section 818 with hooks 820, and a second side section 822 with hooks 824. In an embodiment, the first and second side sections 818 and 822 extend below the main section 816 to form an opening, such that when the partition component 814 is fully inserted and secured within the first portion 802 of the main air duct component 704 air can pass from the first portion 702 to the second portion 704. In this situation, the partition component 814 can be connected to the first portion 802 via the grates 810 and 812 and hooks 820 and 824, as will be described in greater detail with respect to FIGS. 9-13 below. The partition component 814 can direct air flow through the main air duct component 704 and out of the main air duct component 704 via the first and second side vent regions.

The main air duct component 704 can be placed in the second configuration by the partition component 814 being pushed into the first portion 802 in the direction of arrow A in FIG. 9, and the first and second side covers 210 and 220 not being located on the main air duct component 704.

Referring now to FIG. 10, when the partition component 814 placed in a first position within the first portion 802, an arrow 1002 on the partition component 814 is aligned with an unlocked indicator 1004 on the grate 810. The partition component 814 can then be pushed toward the grates 810 and 812. When the partition component 814 is placed in a second position and is in physical contact with the grates 810 and 812, the arrow 1002 is aligned with the lock indicator 1102 as shown in FIG. 11. Additionally, when the partition component 814 is in the second position, the hooks 820 snap fit with the grate 810 and the hooks 824 snap fit with the grate 812, as shown in FIG. 12. Referring now to FIG. 13, the main air duct component 704 is in the second configuration, such that air flow from the first portion of cooling fans 706 can be directed by the main air duct component 704 in the direction of arrows 1302, 1304, and 1306. When the main air duct component 704 is in the second configuration, a first portion of a total amount of air flow from the cooling fans 706 can be directed through the main air duct component 704, and a second portion of the total amount can be directed to the GPUs 712. In an embodiment, the first amount of air flow can be about 62.5% of the total air flow produced by the first portion of cooling fans 706, and the second amount of air flow can be about 37.5% of the total air flow. One of ordinary skill in the art will recognize that other divisions of the total air flow between the CPUs 708 and DIMMs 710 and the GPUs 712, while the main air duct component 704 is in a second configuration, can be made without varying from the scope of this disclosure.

In an embodiment, the partition 814 can be removed from the first portion 802 by a force being applied on the hooks 820 to release the hooks 820 from the grate 810, and by a force being applied on the hooks 824 to release the hooks 824 from the grate 812. In response to the hooks 820 and 824 being released from their respective locations, the partition 814 can be removed from the first portion 802 such that the main air duct component 104,704 is no longer in either of the first configuration or the second configuration.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a tray including a plurality of central processing units; and
a main air duct component to mount on the tray over the central processing units, the main air duct component configured to receive first and second side covers and a partition, the main air duct component including:
a first portion having a first side vent region and a second side vent region, the main air duct component to receive the first and second side covers to cover the first and second side vent regions in response to the main air duct component being in a first configuration, and the main air duct component to receive the partition within the first portion to direct respective side air flows out of the first and second side vent regions in response to the main air duct component being in a second configuration.

2. The information handling system of claim 1, wherein the central processing units are located within a center on the tray, a first portion of other components is located in between the central processing units and a first edge of the tray, and a second portion of the other components is located in between the central processing units and a second edge of the tray.

3. The information handling system of claim 2, the main air duct component further comprising:
a second portion connected to the first portion, the second portion having a main air duct channel to direct a main air flow over the central processing units.

4. The information handling system of claim 1, further comprising other components that include a plurality of dual inline memory modules located under the main air duct component along with the central processing units.

5. The information handling system of claim 1, further comprising other components that include a plurality of peripheral component interconnect express slots located outside of the main air duct component.

6. The information handling system of claim 5, wherein the main air duct component is placed in the first configuration.

7. The information handling system of claim 1, further comprising a plurality of graphic processing units located outside of the main air duct component.

8. The information handling system of claim 7, wherein the main air duct component is placed in the second configuration.

9. An information handling system comprising:
a tray including a plurality of central processing units; and
a main air duct component to mount on the tray over the central processing units, the main air duct component configured to receive a first side cover and a partition, the main air duct component including a first portion having:
first and second side vent regions to direct respective amounts of air flows out of the main air duct component;
a first latch in physical contact with a back surface of the portion of the main air duct component; and
a grate within the portion of the main air duct component;
wherein the first side cover is in physical contact with the portion of the main air duct component when the main air duct component is in a first configuration, the first side cover including a tab and a hook, the tab to be inserted through the latch until the hook snap fits with the latch to securely connect the first side cover to the portion of the main air duct component, and
wherein a partition is in physical contact with the grate within the portion of the main air duct component when the main air duct component is in a second configuration, the partition to direct the respective side air flows out of the first and second side vent regions.

10. The information handling system of claim 9, wherein the central processing units are located within a center on the tray, a first portion of other components is located in between the central processing units and a first edge of the tray, and a second portion of the other components is located in between the central processing units and a second edge of the tray.

11. The information handling system of claim 9, wherein the partition includes a hook to snap fit with the grate to securely hold the partition in physical contact with the grate.

12. The information handling system of claim 9, further comprising a plurality of graphic processing units located outside of the main air duct component.

13. The information handling system of claim 12, wherein the main air duct component is placed in the second configuration.

14. The information handling system of claim 9, further comprising a plurality of peripheral component interconnect express slots located outside of the main air duct component.

15. The information handling system of claim 14, wherein the main air duct component is placed in the first configuration.

16. The information handling system of claim 9, the portion of the main air duct component further including:
a second latch in physical contact with a back surface of the portion of the main air duct component.

17. The information handling system of claim 16, the main air duct component further configured to receive a second side cover, the main air duct component further including:
a second side cover be placed in physical contact with the portion of the main air duct component and to cover the second side vent region when the main air duct component is in the first configuration, the second side cover including a second tab and a second hook, the second tab to be inserted through the second latch until the second hook snap fits with the second latch to securely connect the second side cover to the portion of the main air duct component.

18. An information handling system comprising:
a tray including:
a plurality of cooling fans; and
a plurality of central processing units;
a main air duct component to mount on the tray over the central processing units, the main air duct component configured to receive first and second side covers and a partition, the main air duct component including:
a portion having a first side vent region and a second side vent region, the main air duct component to receive the first and second side covers to cover the first and second side vent regions in response to the main air duct component being in a first configuration, the first and second side covers prevent air from the cooling fans from leaving the main air duct component via the first and second side vent regions while the main air duct component is in the first configuration, and the main air duct component to receive the partition within the portion to direct respective side air flows from the cooling fans out of the first and second side vent regions in response to the main air duct component being in a second configuration.

19. The information handling system of claim 18, wherein the main air duct component is placed in the first configuration in response to the central processing units producing more heat than other components of the tray.

* * * * *